United States Patent
Suematsu

(10) Patent No.: US 6,776,624 B2
(45) Date of Patent: Aug. 17, 2004

(54) SOCKET FOR ELECTRICAL PARTS

(75) Inventor: Hiroshi Suematsu, Kawaguchi (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 10/173,117

(22) Filed: Jun. 18, 2002

(65) Prior Publication Data
US 2002/0197891 A1 Dec. 26, 2002

(30) Foreign Application Priority Data
Jun. 20, 2001 (JP) .................................. 2001-186924

(51) Int. Cl.$^7$ ............................................. H01R 12/00
(52) U.S. Cl. ........................ 439/71; 439/66; 439/591; 439/91
(58) Field of Search ...................... 439/66, 71, 591, 439/91

(56) References Cited

U.S. PATENT DOCUMENTS

| 5,192,213 A | * | 3/1993 | Kosugi et al. ............... 439/66 |
| 5,324,205 A | * | 6/1994 | Ahmad et al. ............... 439/66 |
| 5,362,241 A | * | 11/1994 | Matsuoka et al. ........... 439/66 |
| 5,759,048 A | * | 6/1998 | Korsunsky et al. .......... 436/66 |
| 6,024,579 A | * | 2/2000 | Bennett ....................... 439/66 |

FOREIGN PATENT DOCUMENTS

| JP | 09-270288 | 10/1997 |
| JP | 10-116670 | 5/1998 |

OTHER PUBLICATIONS

Search report from the Japan Patent Office, whch recites published patent 09–270288A/1977, issued Jan. 13, 2004.

* cited by examiner

Primary Examiner—P. Austin Bradley
Assistant Examiner—Briggitte R. Hammond
(74) Attorney, Agent, or Firm—Staas & Halsey LLP

(57) ABSTRACT

An IC socket for an IC package as an electrical part has a socket body to which a number of contact pins are arranged so as to establish an electrical connection between a printed circuit board and a terminal of the IC package. The contact pin comprises a first contact piece disposed on an electrical part side so as to contact the terminal of the electrical part and a second contact piece disposed on a printed circuit board side so as to contact the printed circuit board. When the first contact piece contacts the terminal and is pressed, the first contact piece is inclined and a contact end portion of the first contact piece is moved so as to slide with respect to the electrical part.

15 Claims, 9 Drawing Sheets

PRIOR ART

SOCKET FOR ELECTRICAL PARTS

BACKGROUND OF THE INVENTION

1. Field of the Invention

The present invention relates to a socket for electrical parts for detachably accommodating and holding an electrical part such as a semiconductor device (called as "IC package" hereinlater), and more particularly, relates to a socket for an electrical part having improved contact pins to be contacted to or separated from terminals of the electrical part.

2. Related Art of the Invention

In a known art, there is provided a socket of the type mentioned above, for example, as disclosed it Japanese Patent Laid-open Publication No. HEI 10-116670, which shows a structure, as shown in FIG. 9, in which a device 3 achieves an electrical connection between a terminal 1a of an IC package as an electrical part and a terminal 2a of a printed circuit board 2 and a contact pin 4 is arranged to a body of the device (socket) 3.

The contact pin 4 shown in FIG. 9 is formed from a conductive plate member with engaging grooves 4a and 4b at both end portions. A support structure is provided by fitting an elastic element 5 to one 4a of the engaging grooves and a hard element 6 to the other one 4b of the engaging grooves.

With reference to FIG. 9, an upper end portion of such contact pin 4 abuts against the terminal 1a of the IC package and a lower end portion thereof abuts against the terminal 2a of the printed circuit board 2 to thereby establish an electrical connection, through the contact pin 4, between the terminal 1a of the IC package 1 and the terminal 2a of the printed circuit board 2.

In such contact pin 4, the engaging groove 4b has relatively long slot shape in the vertical direction, and accordingly, when the IC package 1 is depressed downward, the contact pin 4 may somewhat be rotated and the contacting portion of the contact pin 4 slightly slides on the lower surface of the terminal 1a of the IC package 1, thus achieving wiping effect. Further, such sliding motion will be observed between the contact pin 4 and the terminal 2a of the printed circuit board 2.

However, in such socket of the prior art, the contact pin 4 has a predetermined proper width, but it has a long length extending in an oblique direction, as viewed, so as to provide a rotational structure, and therefore, the contact pin 4 occupies a relatively large location space with respect to the device body 3 and it is difficult to effectively improve a high frequency characteristic of the contact pin 4.

Moreover, in a structure in which the terminals 1a of the IC package 1 are formed to four sides of an IC package having rectangular shape, it is difficult to arrange the contact pins 4, and it is hence difficult to carry out an inspection of such IC package 1.

SUMMARY OF THE INVENTION

An object of the present invention is to substantially eliminate defects or drawbacks encountered in the prior art described above and to provide a socket for an electrical part such as IC package capable of improving a high frequency characteristic of a contact, i.e. contact pin, disposing the contact pin in a narrow space and suitably carrying out an inspection of the IC package.

This and other objects can be achieved according to the present invention by providing a socket for an electrical part having a socket body in which an electrical part is accommodated and to which a number of contact pins are arranged so as to be contacted to or separated from terminals provided for an electrical part and to thereby establish an electrical connection between a printed circuit board and the terminal of the electrical part, the contact pin comprising a first contact piece disposed on an electrical part side so as to contact the terminal of the electrical part and a second contact piece disposed on a printed circuit board side so as to contact the printed circuit board, wherein when the first contact piece contacts the terminal of the electrical part and is then pressed, the first contact piece is inclined and a contact end portion of the first contact piece is moved so as to slide with respect to the electrical part.

In preferred embodiments, the first and second contact pieces of the contact pin have central axes offset from each other and when the first contact piece contacts the terminal of the electrical part and is then pressed, the first contact piece is inclined and a contact end portion of the first contact piece is moved so as to slide with respect to the electrical part.

The first contact piece is provided with a contact end portion, offset from the central axis of the first contact piece, having a shape capable of contacting the terminal of the electrical part and when the first contact piece contacts the terminal of the electrical part and is then pressed, the first contact piece is inclined and a contact end portion of the first contact piece is moved so as to slide with respect to the electrical part.

The first contact piece has a circular portion and the second contact piece has a contact receiving portion for receiving and supporting the circular portion of the first contact piece to be movable. The second contact piece is provided with a pair of elastic pieces, as a contact receiving portion, supporting the first contact piece. The elastic pieces have different elastic forces so that when the first contact piece contacts the terminal of the electrical part and is then pressed, the first contact piece is inclined and a contact end portion of the first contact piece is moved so as to slide with respect to the electrical part.

The first and second contact pieces are formed independently to be flat by punching out plate members composed of, for example, a beryllium copper material.

The second contact piece of the contact pin is supported by a cushion member and when the cushion member is elastically deformed, the second contact piece is allowed to be inclined and is returned to a vertical position by an elastic force of the cushion member.

The socket is an IC socket and the electrical part is an IC package of land grid array type.

According to the present invention of the structures mentioned above, the contact pin provided for the socket body of the socket for an electrical part comprises a first contact piece disposed on an electrical part side (electrical part side contact piece) so as to contact the terminal of the electrical part and a second contact piece disposed on a printed circuit board side (printed circuit board side contact piece) so as to contact the printed circuit board, wherein when the first contact piece contacts the terminal of the electrical part and is then pressed, the first contact piece is inclined and a contact end portion of the first contact piece is moved so as to slide with respect to the electrical part. Therefore, an improved wiping effect can be achieved and a high frequency characteristic of the contact pin can be also improved. The contact pins of the structure mentioned above have a reduced space for the location. Moreover, an inspection of an electrical part formed with four terminals at its four sides can be effectively performed.

Furthermore, the electrical part side contact piece can be easily inclined with a simple design change. The contact pressure between the electrical part side contact piece of the contact pin and the printed circuit board side contact piece thereof can be surely maintained by forming the elastic portions for supporting the electrical part side contact piece.

The nature and further characteristic features of the present invention will be made further clear from the following descriptions made with reference to the accompanying drawings.

BRIEF DESCRIPTION OF THE DRAWINGS

In the accompanying drawings:

FIG. 4 represents an IC package concerning the embodiment shown in FIG. 1, in which

DESCRIPTION OF THE PREFERRED EMBODIMENTS

[First Embodiment]

Figure 1:
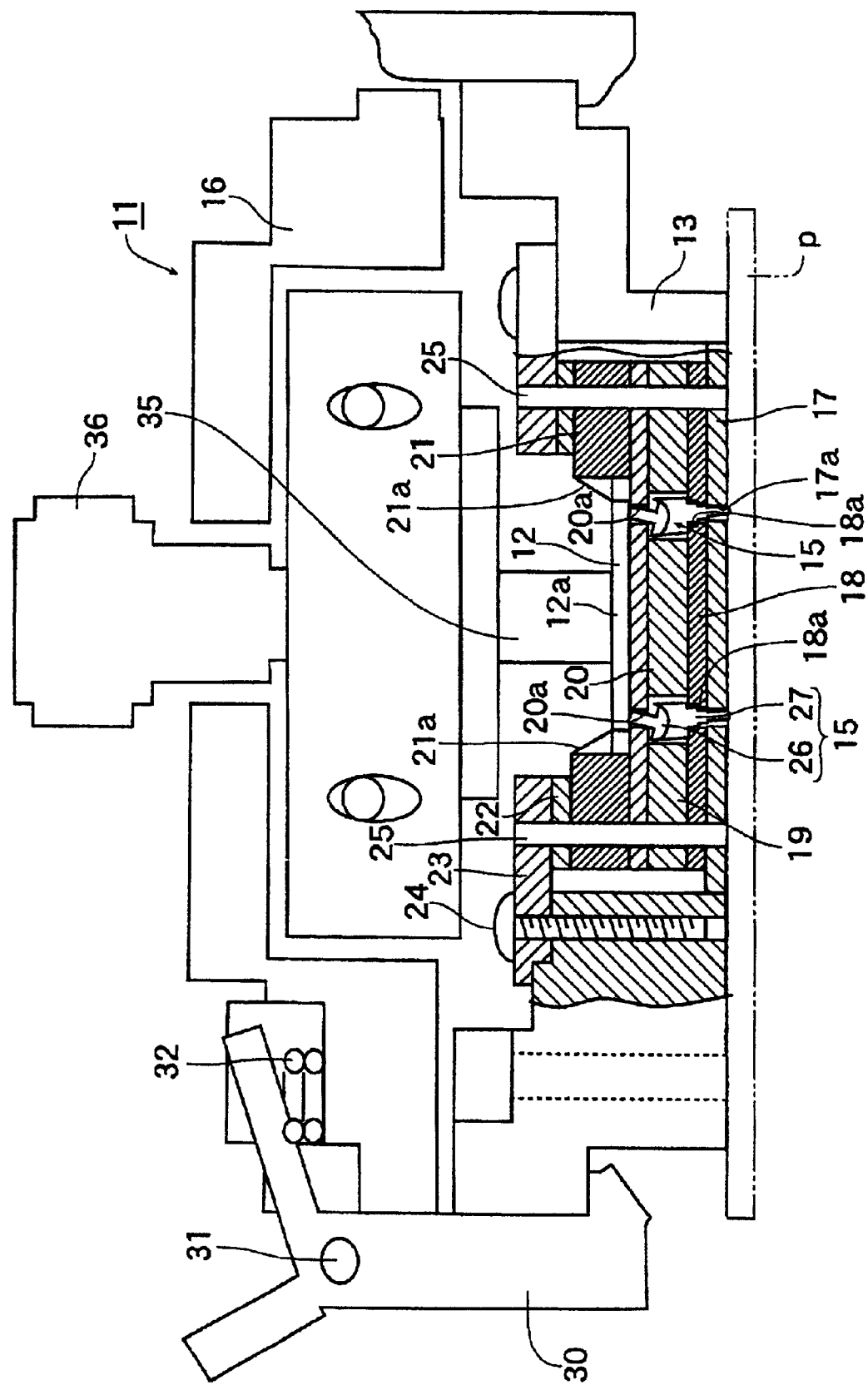
FIG. 1 is a schematic view, partially in section, of an IC socket as a socket for electrical parts according to a first embodiment of the present invention.
Figure 2:
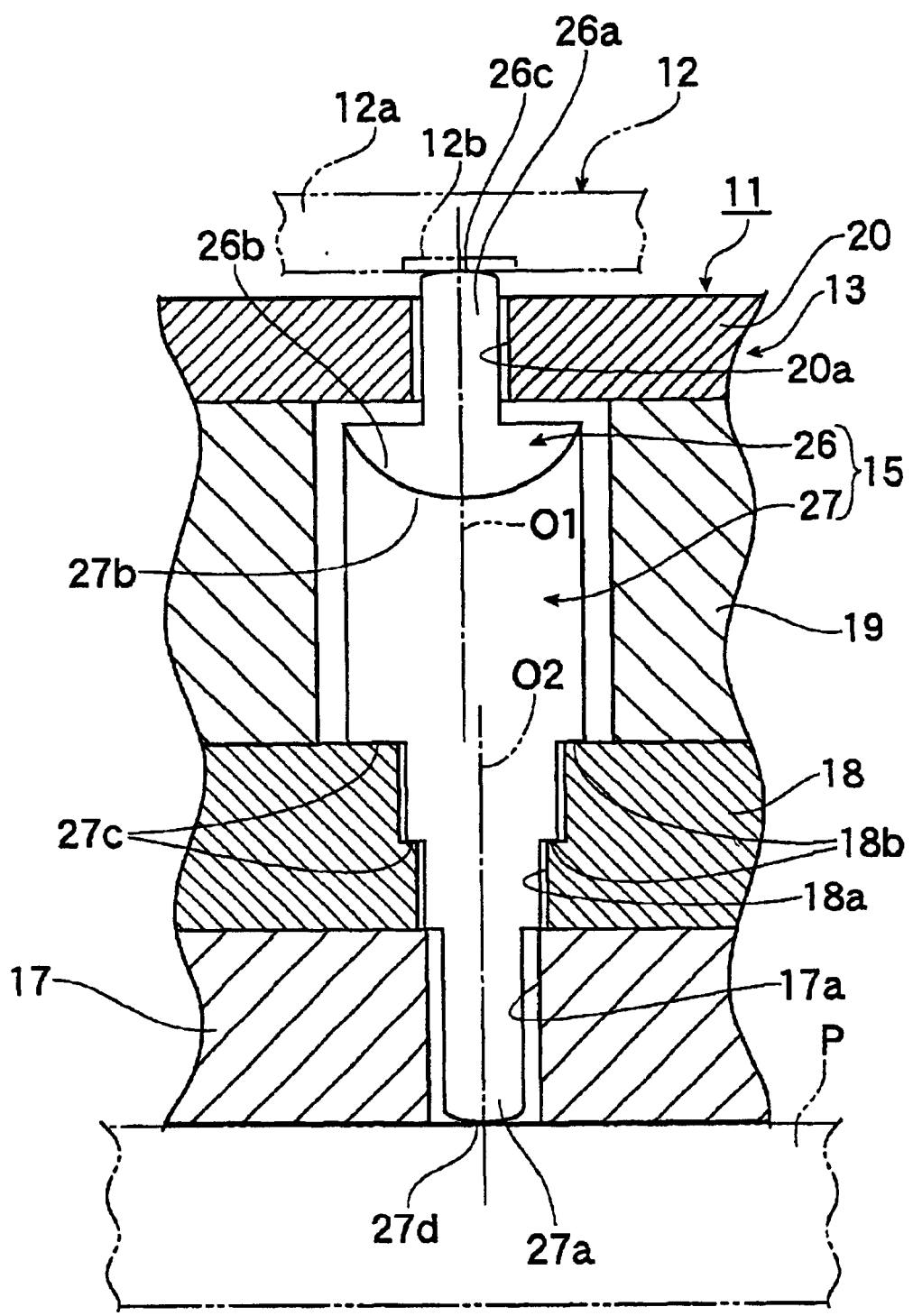
FIG. 2 is a sectional view showing an arrangement of a contact pin of the IC socket of FIG. 1.

FIGS. 1 to 4 represent a first embodiment of a socket for an electrical part according to the present invention.

With reference to FIGS. 1 to 4A and 4B, an IC socket as an "socket for an electrical part" is denoted by reference numeral 11, which is utilized for achieving electrical connection between a plate-shaped terminal 12b of an IC package 12 as an electrical part for the purpose of carrying out a performance test of the IC package 12 and a printed circuit board P of a measuring device such as tester.

Figure 4A:
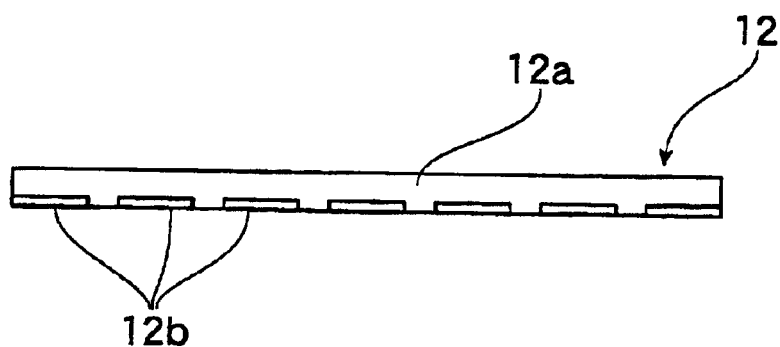
FIG. 4A is a front view of the IC package and FIG. 4B is a bottom view thereof.
Figure 4B:
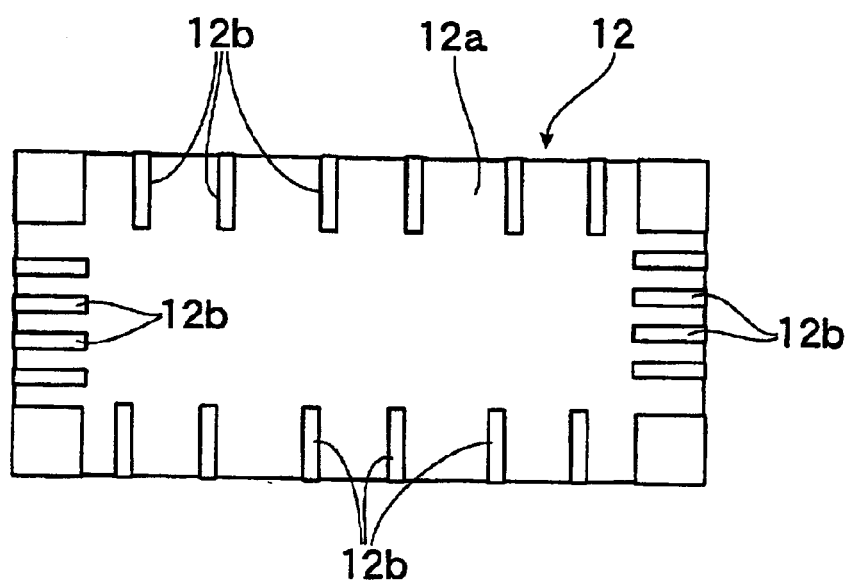

The IC package 12 has so-called an LGA-type (Land Grid Array type), as shown in FIGS. 4A and 4B, comprising a package body 12a having a longitudinal structure and a number of plate-shaped terminals 12b disposed to four side portions on a lower surface (as viewed) of the package body 12a so as to provide substantially flat surface.

On the other hand, the IC socket 11 has, as shown in FIG. 1, a socket body 13 which is mounted to the printed circuit board P, and a number of contact pins 15 are arranged to the socket body 13 so as to be contacted to or separated from the terminals 12b of the IC package 12. A cover member 16 is also provided for the socket body 13 to be opened or closed.

The socket body 13 also has a base portion 17, on which, as shown in FIG. 1, a cushion member 18, a blade housing 19, a disc press 20, a positioning plate 21 and a press cushion 22 are disposed in a laminated state in this order from the base portion 17. Such laminated structure is pressed downward by a pressing plate 23 fixed to the socket body 13 by means of pressing (fastening) screw 24, and positioning pins 25 penetrate this laminated structure to thereby position the cushion member 18 and so on.

Each of the contact pins 15 is composed of a contact piece 26, positioned on the electric part side, contacting the IC package 12 and another contact piece 27, disposed on the printed circuit board side, contacting the printed circuit board P. These contact pieces 26 and 27 are formed independently by punching out plate members formed of, for example, beryllium copper so as to provide flat plates shapes having for example 0.2 mm. Further, these contact pieces 26 and 27 are called hereunder as electrical part side contact piece 26 and printed circuit board side contact piece 27.

The electrical part side contact piece 26 and the printed circuit board side contact piece 27 are formed independently by punching out the plate members and then assembled when forming the contact pin 15 and mounting to the socket body be slidable from each other in a manner mentioned hereinlater.

The electrical part side contact piece 26 is provided with a contacting portion 26a contacting the terminal 12b of the IC package 12 and a circular (arcuate) portion 26b contacting the printed circuit board side contact piece 27. The contacting portion 26a is inserted into a through hole 20a formed to the disc press 20, and the contacting portion 26a has a tip end portion, as a contact end portion 26c having a circular shape, which contacts the plate-shaped terminal 12b of the IC package 12.

On the other hand, the printed circuit board side contact piece 27 is provided with a lower (as viewed in FIG. 2, for example) contact portion 27a contacting the printed circuit board P and a contact receiving portion 27b contacting the circular portion 26b of the electrical part side contact piece 26. The contact portion 27a is inserted into a through hole 17a formed to the base 17 and a through hole 18a formed to the cushion member 18. The contact piece 27 is also formed with a staged portions 27c between the contact receiving portion 27b and the contact portion 27a so as to be engaged with staged portion 18b of the cushion member 18 and the base portion 17 to thereby support the printed circuit board side contact piece 27 by the cushion member 18 and prevent it from coming off in the downward direction.

The electrical part side contact piece 26 and the printed circuit board side contact piece 27 may be formed so that their central axes O1 and O2 are offset from each other.

Figure 3:
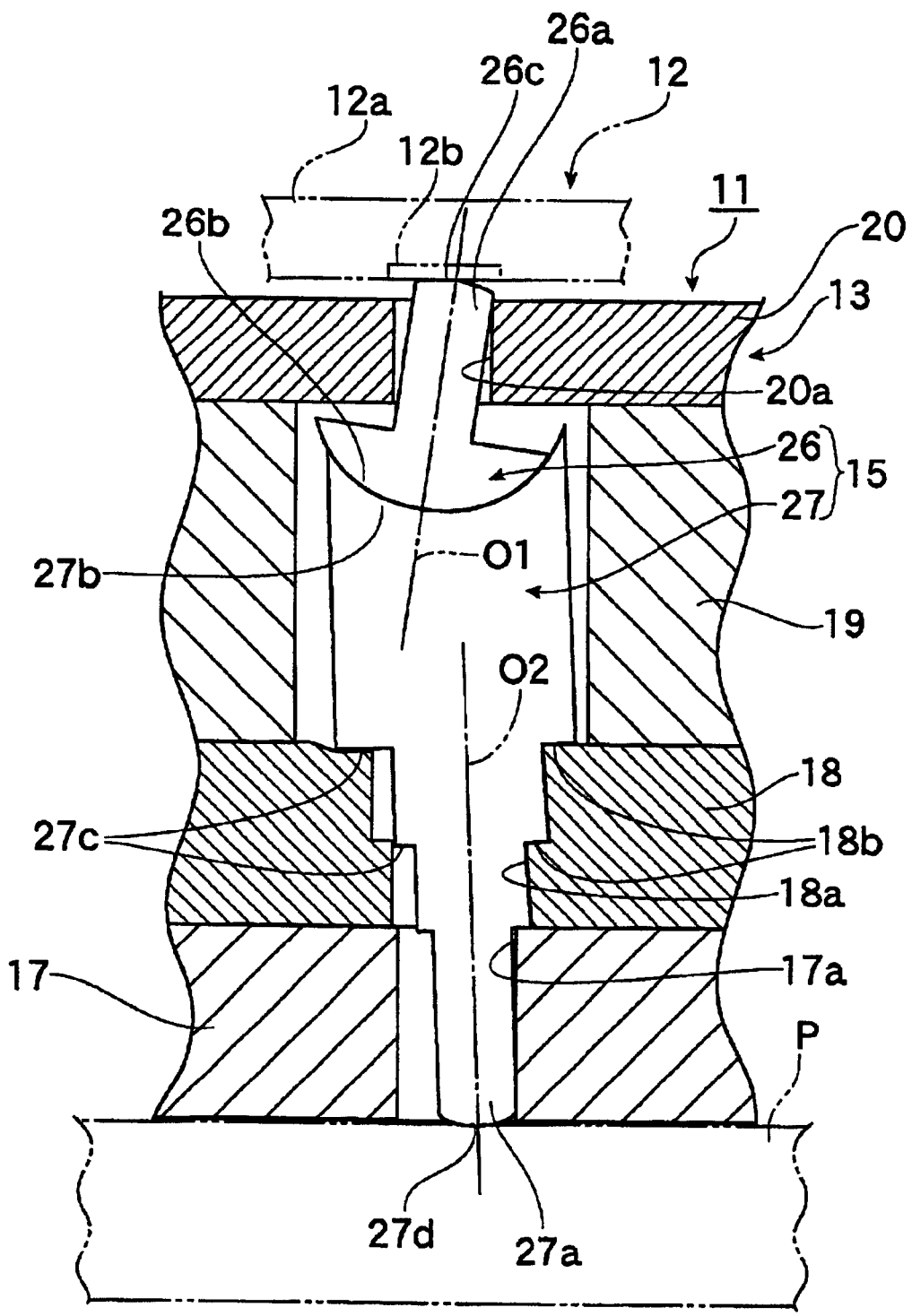
FIG. 3 is a sectional view similar to that of FIG. 2, but a contact portion of the contact pin on the side of the electrical part is inclined.

According to such arrangement, when the electrical part side contact piece 26 abuts against the plate-shaped terminal 12b of the IC package 12, this contact piece 26 is depressed downward, and on the contrary, when the printed circuit board side contact piece 27 abuts against the printed circuit board P, this contact piece 27 is pushed upward. In this state, since the central axes O1 and O2 are offset from each other, both the contact pieces 26 and 27 are inclined as shown in FIG. 3. Accordingly, the contact end portion 26c of the contact piece 26 moves and slides on the plate-shaped terminal 12b of the IC package 12, and the contact end portion 27d of the other contact piece 27 in inclined to thereby slide on the printed circuit board P.

Incidentally, as shown in FIG. 1, the cover member 16 is mounted, at its front side end (left side as viewed), with a latch member 30 to be pivotal about a rotational shaft 31, and the latch member 30 has a structure to be engaged with the socket body 13. The latch member 30 is urged by a spring 32 in the engaging direction.

A pressing member 35 is mounted to the cover member 16 for pressing the IC package 12 to be vertically movable in the closed state of the cover member 16 as shown in FIG. 1, and by a position adjusting member 36, a height thereof, i.e. its pressure, can be adjusted.

Further, it is to be noted that terms "upper", "lower", "right", "left", "front", "rear" and the like are used herein with reference to the illustration on the drawings or in an installed or usable state.

The function and operation of the socket for electrical parts according to the first embodiment having the structure mentioned above will be described hereunder.

When it is required to set the IC package 12 to the IC socket 11 under the state that the IC socket 11 is mounted on the printed circuit board P, the IC package 12 is set on the disc press 20 of the socket body 13 with the cover member 16 being opened. In this operation, the IC package 12 is guided by the guide portions 21a of the positioning plate 21 to a predetermined position and then accommodated there.

From the state mentioned above, when the cover member 16 is closed, the latch member 30 is engaged with the socket body 13, and accordingly, the upper surface of the package body 12a of the IC package 12 is depressed downward by the pressing member 35 mounted to the cover member 16.

Then, the electrical part side contact piece 26 abuts against the plate-shaped terminal 12b of the IC package 12 and is depressed downward, and on the other hand, the printed circuit board side contact piece 27 abuts against the printed circuit board P and is pushed upward.

In this instance, since the central axes O1 and O2 of these contact pieces 26 and 27 are offset from each other, these contact pieces 26 and 27 are inclined as shown in FIG. 3.

According to such inclining motion of these contact pieces 26 and 27, the contact end portion 26c of the electrical part side contact piece 26 is inclined and slides on the plate-shaped terminal 12b of the IC package 12, thus achieving a wiping effect, and on the other hand, the contact end portion 27d of the printed circuit board side contact piece 27 is also inclined and slides on the printed circuit board P, thus also achieving a wiping effect.

In this embodiment, the contact pin 15 is divided into the electrical part side contact piece 26 and the printed circuit board side contact piece 27, and the central axes O1 and O2 of these contact pieces 26 and 27 are offset from each other, so that both the contact pieces 26 and 27 are inclined to thereby achieve the wiping effect. Therefore, it is not necessary to arrange a contact pin having a length extending in an oblique direction, and accordingly, it becomes possible to measure high frequency (such as more than 2 Ghz), and moreover, since the electrical part side contact piece 26 and the printed circuit board side contact piece 27 are aligned substantially vertically with each other, the location space of the contact pin can be reduced to be narrow, thus being advantageous.

Furthermore, since the contact pin 15 is divided into the electrical part side contact piece 26 and the printed circuit board side contact piece 27, the electrical part side contact piece 26 can be easily exchanged with another one having different contacting portion 26a.

Figure 9:
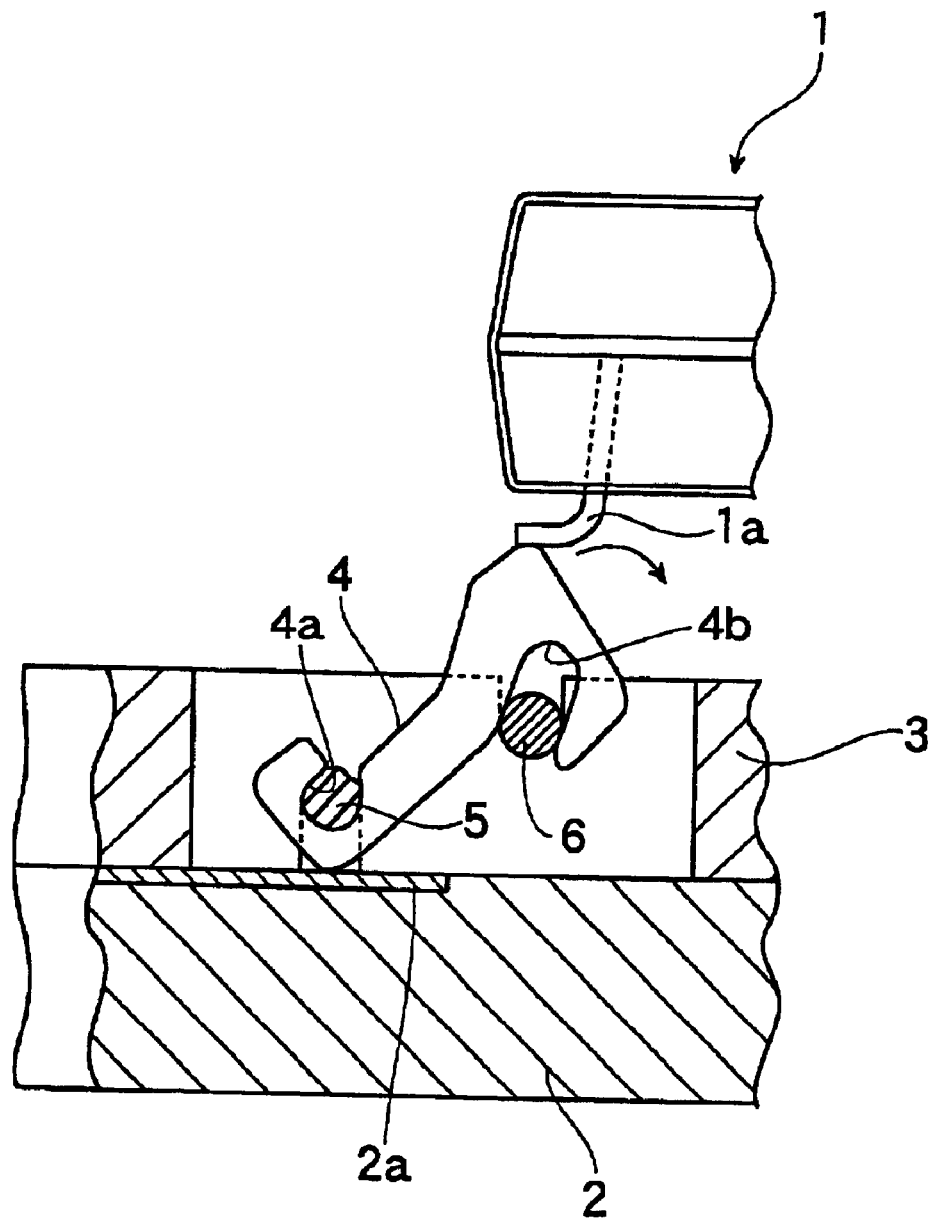
FIG. 9 is a sectional view showing an arrangement of a contact pin of an IC socket having a conventional structure.

Still furthermore, since it is not necessary for the contact pin 15 of this embodiment to be provided with the elastic element 5 and the hard element 6 for supporting the contact pin 4 as in the conventional structure shown in FIG. 9, the contact pins 15 can be arranged for the IC package 12 even in the case in which the plate-shaped terminals 12b are arranged on four sides of the package body 12a of the IC package 12.

Still furthermore, since these contact pieces 26 and 27 can be formed by punching out the flat plate members, the structure thereof is very simple and thus easily manufactured.

Still furthermore, since the printed circuit board side contact piece 27 is supported by the cushion member 18, when the cushion member 18 is elastically deformed, the inclination of this contact piece 27 is acceptable, and by the restoring force of this cushion member 18, the inclined contact piece 27 will be easily returned to the standing state.

[Second Embodiment]

Figure 5:
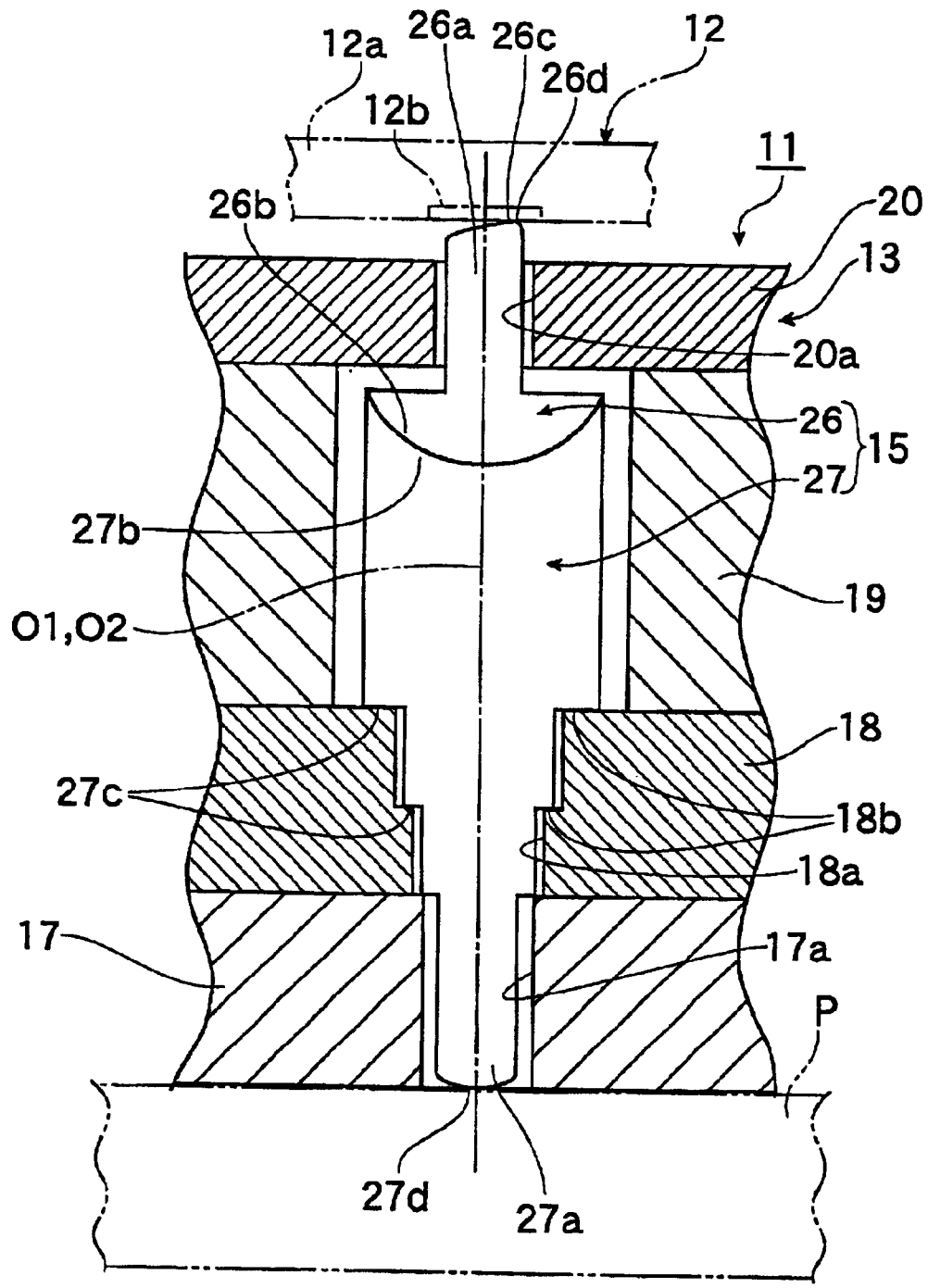
FIG. 5 is a sectional view similar to that of FIG. 2 but related to an IC socket of a second embodiment of the present invention.

FIG. 5 represents a second embodiment of the socket for an electrical part of the present invention.

In this second embodiment, the central axis O1 of the electrical part side contact piece 26 and the axis O2 of the printed circuit board side contact piece 27 are aligned on the same line. However, in this second embodiment, the contact end portion 26c of the electrical part side contact piece 26 of the contact pin 15 has a shape contacting plate-shaped terminal 12b of the electrical part (IC package) 12 at a portion offset from the central axis O1 of the contact piece 26.

In other words, the contact end portion 26c of the electrical part side contact piece 26 of the contact pin 15 is inclined and an inclined-angle portion 26d at the front end portion of this inclining portion contacts the plate-shaped terminal 12b of the IC package 12.

According to such structure as mentioned above, when the inclined-angle portion 26d is contacted to the terminal 12b of the IC package 12 and pressed thereby, the electrical part side contact piece 26 is inclined and, hence, the inclined-angle portion 26d is slid on the plate-shaped terminal 12b of the IC package 12, thus achieving wiping effect.

It is of course possible to, in addition, offset the axes of the electrical part side contact piece 26 and the printed circuit board side contact piece 27 from each other.

Structures and functions of the IC socket of this second embodiment other than those mentioned above are substantially the same as those of the first embodiment, so that the details thereof are omitted herein.

[Third Embodiment]

Figure 6:
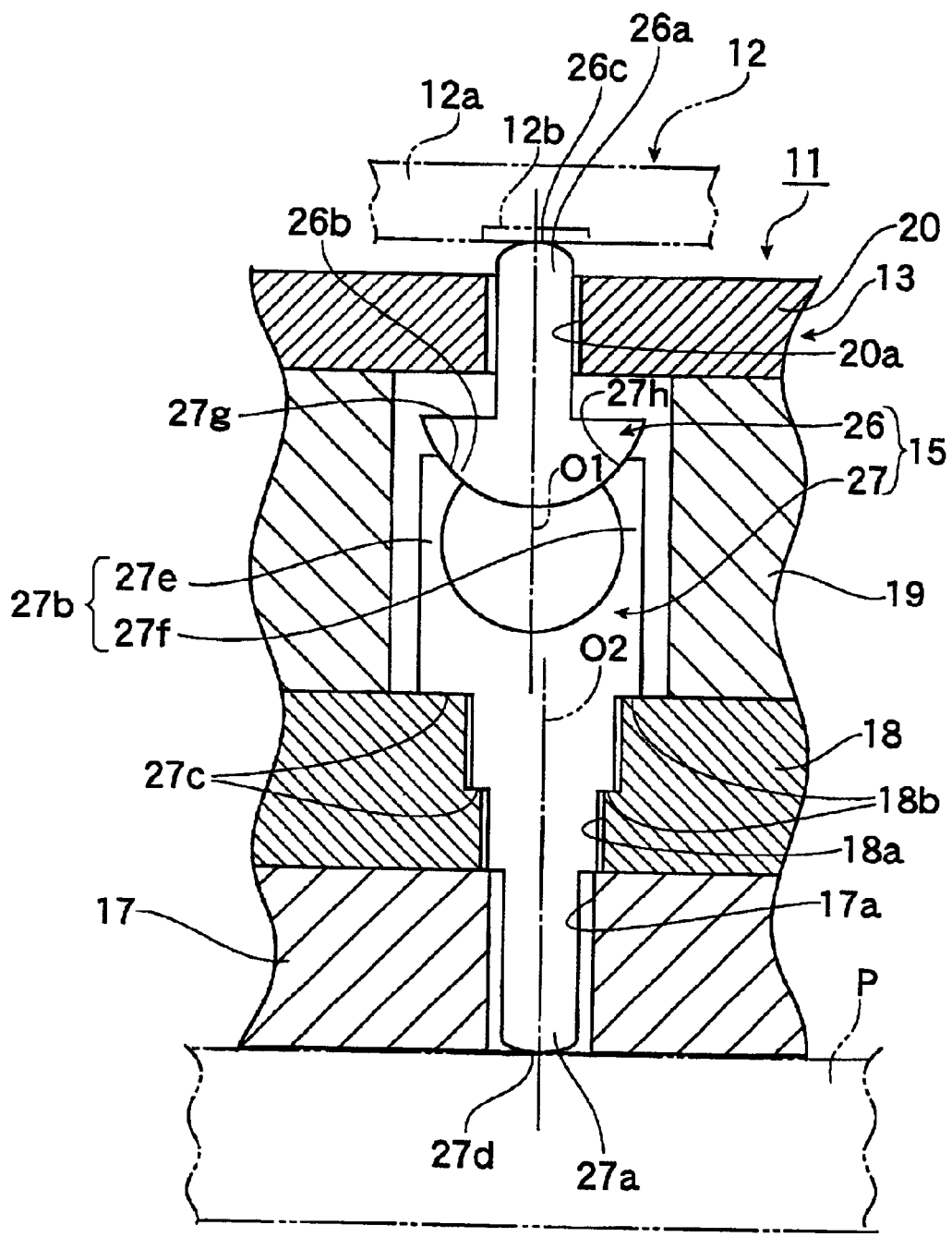
FIG. 6 is a sectional view similar to that of FIG. 2 but related to an IC socket of a third embodiment of the present invention.
Figure 7:
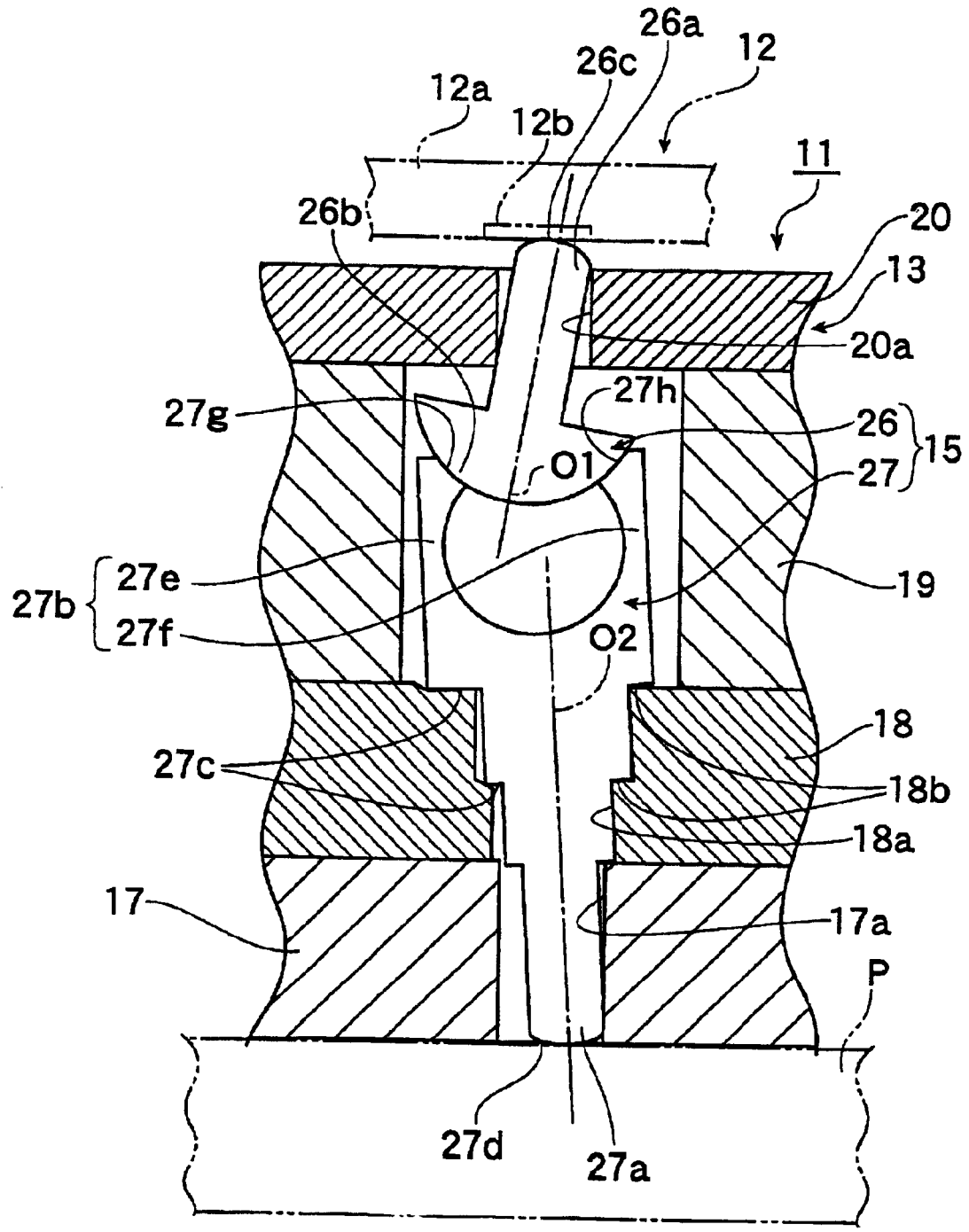
FIG. 7 is a sectional view similar to that of FIG. 3 but related to an IC socket of the third embodiment.

FIGS. 6 and 7 represent the third embodiment of the present invention, and this third embodiment differs from the first embodiment in the shape of the printed circuit board side contact piece 27.

More in detail, the receiving portion 27b of the printed circuit board side contact piece 27 of the contact pin 15 is composed of a pair of lateral elastic pieces (spring pieces) 27e and 27f, which have front end portions formed as arcuate (circular) contact end portions 27g and 27h to which the circular portion 26b of the electrical part side contact piece 26 is contacted.

In the contact pin 15 of the IC socket 11 of this structure, the central axis O1 of the electrical part side contact piece 26 of the contact pin 15 is offset from the axis O2 of the printed circuit board side contact piece 27 of the contact pin 15, both the contact pieces 26 and 27 are inclined as shown in FIG. 7, thus achieving the wiping effect.

Moreover, in this third embodiment, the spring pieces 27e and 27f are formed to the printed circuit board side contact piece 27 to thereby urge the electrical part side contact piece 26, so that the contacting pressure against the plate-shaped terminal 12b of the IC package 12 can be ensured.

In addition, according to the structure of this third embodiment, by removing the electrical part side contact piece, a solder ball of an IC package of a BGA-type (Ball Grid Array type) can be mounted to both the contact end portions 27g and 27h of the spring pieces 27e and 27f, thus preferably carrying out a performance test of the IC socket.

[Fourth Embodiment]

Figure 8:
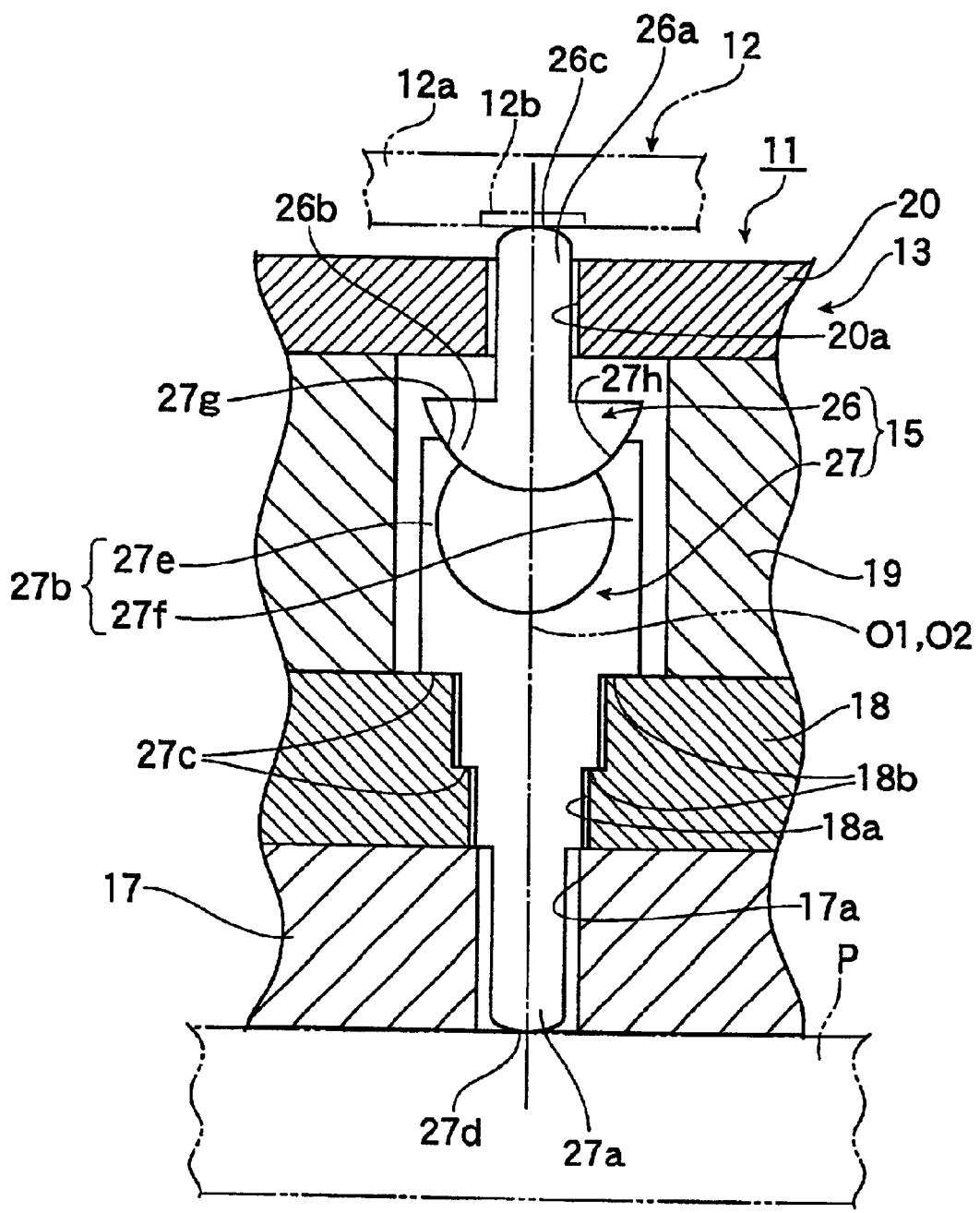
FIG. 8 is a sectional view similar to that of FIG. 2 but related to an IC socket of a fourth embodiment of the present invention.

FIG. 8 represents the fourth embodiment of the present invention.

In this embodiment, comparing with the third embodiment, the central axis O1 of the electrical part side contact piece 26 and the axis O2 of the printed circuit board side contact piece 27 are aligned on the same line, but elastic forces of the spring pieces 27e and 27f of the printed circuit board side contact piece 27 differ from each other. That is, in the illustrated embodiment, the area of the spring piece 27e is formed to be smaller to that of the spring piece 27f, and thus, the elastic force of the spring piece 27e is weaker than that of the spring piece 27f. According to such structure, when the electrical part side contact piece 26 is pushed by the IC package 12, the contact piece 26 is inclined even in the case that the central axes of both the contact pieces 26 and 27 are coincident with each other. Further, it is of course possible to offset these axes O1 and O2 from each other.

Structures and functions of the IC socket of this fourth embodiment other than those mentioned above are substantially the same as those of the third embodiment, so that the details thereof are omitted herein.

It is further to be noted that the present invention is not limited to the described embodiments and many other changes and modifications may be made without departing from the scopes of the appended claims.

For example, although, in the described embodiments, the present invention is applied to the IC socket as a socket for an electrical part, the present invention is not limited to the described device and applicable to other devices or apparatus. The present invention is also applicable, other than the LGA-type IC package, to an IC socket for an IC package of BGA-type or an IC package of gull-wing type.

Furthermore, although, in the described embodiment, the present invention is described by using the IC socket 11 for the IC package 12 in which four plate-shaped terminal 12b are arranged on four sides, one for each side, arrangement of two or three rows of terminals or matrix arrangement thereof may be also equivalently utilized.

What is claimed is:

1. A socket for an electrical part having a socket body in which an electrical part is accommodated and to which a number of contact pins are arranged so as to be contacted to or separated from a terminal provided for an electrical part and to thereby establish an electrical connection between a printed circuit board and the terminal of the electrical part, said contact pin comprising a first contact piece formed to be flat by punching out a plate member and disposed on an electrical part side so as to contact the terminal of the electrical part and a second contact piece formed to be flat by punching out a plate member and disposed on a printed circuit board side so as to contact the printed circuit board, wherein when said first contact piece contacts the terminal of the electrical part and is pressed, the first contact piece is inclined and a contact end portion of the first contact piece is moved so as to slide with respect to the electrical part, wherein said first contact piece has a circular portion and said second contact piece has a contact receiving portion for receiving and supporting the circular portion of the first contact piece to be movable.

2. A socket for an electrical part according to claim 1, wherein said first and second contact pieces of the contact pin have central axes offset from each other and when said first contact piece contacts the terminal of the electrical part and is pressed, the first contact piece is inclined and a contact end portion of the first contact piece is moved so as to slide with respect to the electrical part.

3. A socket for an electrical part according to claim 1, wherein said first contact piece is provided with a contact end portion, offset from the central axis of the first contact piece, having a shape so as to contact the terminal of the electrical part and when said first contact piece contacts the terminal of the electrical part and is pressed, the first contact piece is inclined and a contact end portion of the first contact piece is moved so as to slide with respect to the electrical part.

4. A socket for an electrical part according to claim 1, wherein said first and second contact pieces are formed from a plate member composed of a beryllium copper material.

5. A socket for an electrical part according to claim 1, wherein said socket is an IC socket and said electrical part is an IC package of land grid array type.

6. A socket for an electrical part according to claim 1, wherein said second contact piece is provided with a pair of elastic pieces, as a contact receiving portion, supporting said first contact piece.

7. A socket for an electrical part according to claim 6, wherein said paired elastic pieces have different elastic forces so that when said first contact piece contacts the terminal of the electrical part and is pressed, the first contact piece is inclined and a contact end portion of the first contact piece is moved so as to slide with respect to the electrical part.

8. A socket for an electrical part having a socket body in which an electrical part is accommodated and to which a number of contact pins are arranged so as to be contacted to or separated from a terminal provided for an electrical part and to thereby establish an electrical connection between a printed circuit board and the terminal of the electrical part, said contact pin comprising a first contact piece formed to be flat by punching out a plate member and disposed on an electrical part side so as to contact the terminal of the electrical part and a second contact piece formed to be flat by punching out a plate member and disposed on a printed circuit board side so as to contact the printed circuit board, wherein when said first contact piece contacts the terminal of the electrical part and is pressed, the first contact piece is inclined and a contact end portion of the first contact piece is moved so as to slide with respect to the electrical part, wherein said second contact piece is provided with a pair of elastic pieces, as a contact receiving portion, supporting said first contact piece.

9. A socket for an electrical part according to claim 8, wherein said paired elastic pieces have different elastic forces so that when said first contact piece contacts the terminal of the electrical part and is pressed, the first contact piece is inclined and a contact end portion of the first contact piece is moved so as to slide with respect to the electrical part.

10. A socket for an electrical part having a socket body in which an electrical part is accommodated and to which a number of contact pins are arranged so as to be contacted to or separated from a terminal provided for an electrical part and to thereby establish an electrical connection between a printed circuit board and the terminal of the electrical part, said contact pin comprising first contact piece disposed on an electrical part side so as to contact the terminal of the electrical part and a second contact piece disposed on a printed circuit board side so as to contact the printed circuit board, wherein when said first contact piece contacts the terminal of the electrical part and is pressed, the first contact piece is inclined and a contact end portion of the first contact piece is moved so as to slide with respect to the electrical part, wherein said first and second contact pieces are formed independently to be flat by punching out plate members.

11. A socket for an electrical part according to claim 10, wherein said first and second contact pieces are formed from a plate member composed of a beryllium copper material.

12. A socket for an electrical part having a socket body in which an electrical part is accommodated and to which a number of contact pins are arranged so as to be contacted to or separated from a terminal provided for an electrical part and to thereby establish an electrical connection between a printed circuit board and the terminal of the electrical part, said contact pin comprising first contact piece disposed on an electrical part side so as to contact the terminal of the electrical part and a second contact piece disposed on a printed circuit board side so as to contact the printed circuit board, wherein when said first contact piece contacts the terminal of the electrical part and is pressed, the first contact piece is inclined and a contact end portion of the first contact piece is moved so as to slide with respect to the electrical part, wherein said second contact piece of the contact pin is supported by a cushion member and when said cushion member is elastically deformed, said second contact piece is allowed to be inclined and is returned to a vertical position by an elastic force of the cushion member.

13. A socket for an electrical part according to claim 12, wherein said socket is an IC socket and said electrical part is an IC package of land grid array type.

14. A socket for an electrical part having a socket body in which an electrical part is accommodated and to which a number of contact pins are arranged so as to be contacted to or separated from a terminal provided for an electrical part and to establish an electrical connection between a printed circuit board and the terminal of the electrical part, said contact pin comprising a first contact piece disposed on an electrical part side so as to contact the terminal of the electrical part and a second contact piece disposed on a printed circuit board side so as to contact the printed circuit board, wherein when said first contact piece contacts the terminal of the electrical part and is pressed, the first contact piece is inclined and a contact end portion of the first contact piece is moved so as to slide with respect to the electrical part, and said first contact piece has a circular portion and said second contact piece has a contact receiving portion for receiving and supporting the circular portion of the first contact piece to be movable, wherein said second contact piece of the contact pin is supported by a cushion member and when said cushion member is elastically deformed, said second contact piece is allowed to be inclined and is returned to a vertical position by an elastic force of the cushion member.

15. A socket for an electrical part having a socket body in which an electrical part is accommodated and to which a number of contact pins are arranged so as to be contacted to or separated from a terminal provided for an electrical part and to establish an electrical connection between a printed circuit board and the terminal of the electrical part, said contact pin comprising a first contact piece formed to be flat and disposed on an electrical part side so as to contact the terminal of the electrical part and a second contact piece formed to be flat and disposed on a printed circuit board side so as to contact the printed circuit board, wherein when said first contact piece contacts the terminal of the electrical part and is pressed, the first contact piece is inclined and a contact end portion of the first contact piece is moved so as to slide with respect to the electrical part, said first contact piece has a circular portion and said second contact piece has a contact receiving portion for receiving and supporting the circular portion of the first contact piece to be movable.

* * * * *